United States Patent [19]
Onu

[11] Patent Number: 6,167,351
[45] Date of Patent: Dec. 26, 2000

[54] PERIOD DETERMINATION OF A PERIODIC SIGNAL

[75] Inventor: Dan Onu, Lake Oswego, Oreg.

[73] Assignee: Tektronix, Inc., Beaverton, Oreg.

[21] Appl. No.: 09/047,143

[22] Filed: Mar. 24, 1998

[51] Int. Cl.[7] ................. G01R 25/00; G01R 29/02; G06F 19/00
[52] U.S. Cl. ............................. 702/79; 702/66
[58] Field of Search .................. 702/79, 66, 67, 702/70, 71, 75, 176, 189, FOR 104, 103, 107, 110, FOR 154; 324/76.12, 76.19, 76.24, 76.38, 76.39, 76.52, 76.54; 368/107; 700/34; 704/205

[56] References Cited

U.S. PATENT DOCUMENTS

| | | | |
|---|---|---|---|
| 3,617,900 | 11/1971 | Fink et al. ............................ | 324/76.54 |
| 4,025,920 | 5/1977 | Reitboeck et al. .................... | 342/13 |
| 4,486,900 | 12/1984 | Cox et al. ............................. | 704/207 |
| 4,587,620 | 5/1986 | Niimi et al. .......................... | 702/193 |
| 4,979,110 | 12/1990 | Albrecht et al. ..................... | 600/301 |
| 4,982,439 | 1/1991 | Castelaz .............................. | 382/194 |
| 5,239,497 | 8/1993 | McKay et al. ....................... | 708/422 |
| 5,343,404 | 8/1994 | Girgis .................................. | 702/72 |
| 5,640,431 | 6/1997 | Bruckert et al. ..................... | 375/344 |
| 5,692,008 | 11/1997 | Van Nee .............................. | 375/148 |

*Primary Examiner*—Marc S. Hoff
*Assistant Examiner*—Manuel L. Barbee
*Attorney, Agent, or Firm*—David N. Caracappa; Thomas F. Lenihan

[57] ABSTRACT

A method for determining the period of a periodic signal, possibly including noise, includes the step of calculating a signal representing the difference between the periodic signal, and the periodic signal delayed by a time T. The variance of the difference representative signal is then computed. The steps of computing a difference signal, and determining the variance of the difference signal is repeated for different times T. The period of the periodic signal is determined to be the time T producing the minimum variance. Apparatus implementing this method includes a source of the periodic signal. A difference circuit computes a signal representing the difference between the periodic signal, and the periodic signal delayed by a time T, and a variance circuit computes a signal representing the variance of the difference representative signal. A control circuit varies the time T. A minimum selector selects the time T producing the minimum variance as the period of the periodic signal.

14 Claims, 1 Drawing Sheet

PERIOD DETERMINATION OF A PERIODIC SIGNAL

FIELD OF THE INVENTION

The present invention relates to the determination of the period of a periodic signal.

BACKGROUND OF THE INVENTION

It is often necessary to determine the period of a periodic signal. For example, the period itself may be a desired measurement, such as when analyzing the operation or quality of electronic or electromechanical equipment, e.g. disk drives. Also, many other measurements of periodic signals require the initial specification of the period for their determination.

Digitizing oscilloscopes are often used to sample, store, and display waveforms from such equipment. Digitizing oscilloscopes contain circuitry for converting analog voltages received at the oscilloscope probes to digital samples, and memory for storing some number of such digital samples. Such oscilloscopes further include circuitry which can analyze the stored samples representing the received signal to determine the period of that signal.

Prior circuitry for finding the period of the input signal from the stored samples calculated the autocorrelation of the stored signal. An autocorrelation at a given time is calculated by multiplying samples of the signal of interest by those of the same signal delayed by the given time, then summing those products. The time at which the autocorrelation is maximum is determined to be the period of the input signal. This approach is an iterative procedure, because the period $T_{n+1}$ estimated at step n+1 depends on the previous estimated value $T_n$. In addition, the same is true with respect to the initial user guess, $T_o$. Convergence of the {Tn} series to the true value $T_{PER}$ using this procedure cannot be proven in a mathematically tractable manner for the general case. This process also requires many multiplications, and, thus, is time consuming.

A means for determining the period of an input signal represented by stored samples which is relatively robust, simpler than an autocorrelator, and with predictable outcome is desirable.

SUMMARY OF THE INVENTION

It is assumed that an input signal may be considered to be composed of two components: a periodic component having a period $T_{PER}$, and a noise component which includes every signal feature which is not periodic (i.e. noise and/or non-periodic components). The input signal may be represented by a random variable S, the periodic component may be represented by a random variable P and the noise component may be represented by a random variable N, where S=P+N. Because P and N are independent variates, the variance of S is the sum of the variances of P and N, i.e. $\sigma^2_S = \sigma^2_P + \sigma^2_N$.

In the present invention a version of the input signal is delayed by a time T and is represented by a random variable $S_d(T)$. The delayed signal is composed of a delayed version of the periodic component represented by a random variable $P_d(T)$ and a noise component represented by a random variable $N_d(T)$. The delayed version of the input signal is subtracted from the non-delayed version of the input signal to form a difference signal represented by the random variable $\Delta S(T) = S - S_d(T)$. The difference signal $\Delta S(T)$ also includes a periodic component $\Delta P(T)$, equal to the difference between the periodic component P of the input signal S and the periodic component $P_d(T)$ of the delayed signal $S_d(T)$; and a noise component $\Delta N(T)$, equal to the difference between the noise component N of the input signal S and the noise component $N_d(T)$ of the delayed signal $S_d(T)$. The variance of the difference signal $\Delta S(T)$ signal is $\sigma^2_{\Delta S}(T) = \sigma^2_{\Delta P}(T) + \sigma^2_{\Delta N}(T)$.

When the delayed signal $S_d(T)$ is delayed a time T equal to the period $T_{per}$ (or integer multiples of the period $T_{per}$) of the periodic component P, the delayed periodic component $P_d(T_{per})$ is equal to the (undelayed) periodic component P of the input signal. The periodic component $\Delta P(T)$ of the difference signal $\Delta S$, and the variance $\sigma^2_{\Delta P}(T)$ of the periodic component $\Delta P(T)$, thus, both become zero at such times. At all other times T, the variance $\sigma^2_{\Delta P}(T)$ of the periodic component $\Delta P(T)$ of the difference signal $\Delta S(T)$ is greater than zero. Furthermore, because the periodic component P is a deterministic signal, the delayed periodic component $P_d(T)$ is also a deterministic signal, and the difference $\Delta P(T)$ between the periodic component P and delayed periodic component $P_d(T)$ is a deterministic signal. Consequently, the variance $\sigma^2_{\Delta P}(T)$ of the periodic component $\Delta P(T)$ of the difference signal $\Delta S(T)$ is also a deterministic signal which can be represented by the function f(T). The deterministic function f(T), as described above, is equal to zero when T is equal to integer multiples of the period $T_{per}$ of the periodic component P of the input signal S, and greater than zero otherwise.

The noise component N of the (undelayed) input signal S is statistically independent of the delayed noise component $N_d(T)$. Thus, the variance $\sigma^2_{\Delta N}(T)$ of the difference signal $\Delta S$ is constant and equal to $2\sigma^2_N$. The variance $\sigma^2_{\Delta S}(T)$ of the difference signal is, therefore, given in equation (1). Because the second term is constant, and the first term is zero at times T $$\sigma^2_{\Delta S} = f(T) + 2\sigma^2_N \qquad (1)$$

which are integer multiples of the period $T_{per}$ of the periodic component P of the input signal S and greater than zero otherwise, equation (1) is at a minimum at times T which are integer multiples of the period $T_{per}$ of the periodic component P of the input signal S.

In accordance with principles of the present invention, the period of a periodic signal is determined by computing a signal representing the difference between the periodic signal, and the periodic signal delayed by a time T. The variance of the difference representative signal is then computed. The difference representative signal and variance are computed for different times T. The period of the periodic signal is determined to be the time T producing the minimum variance.

Apparatus according to the present invention includes a source of a periodic signal. A difference computing circuit computes the difference between the periodic signal, and the periodic signal delayed by a time T. A variance computing circuit computes the variance of the difference representative signal. A control circuit varies the time T. A minimum selector selects the time T producing the minimum variance as the period of the periodic signal.

The present invention assumes only that the periodic signal and the noise are statistically independent (the same assumption made by prior art methods), and that the signals shifted in time are independent. No assumptions about the probability density functions of the noise or signal are required. In addition, the length of the signal used to determine the variances, as described above, is not specified, and can be of any length. This method, therefore, is simple and relatively robust. In addition, only a subtraction is required, before statistical tools and techniques are used. One skilled in the art will understand that linear systems theory permits precise predictions of the outcome a system according to the present invention

DETAILED DESCRIPTION

Figure 1:
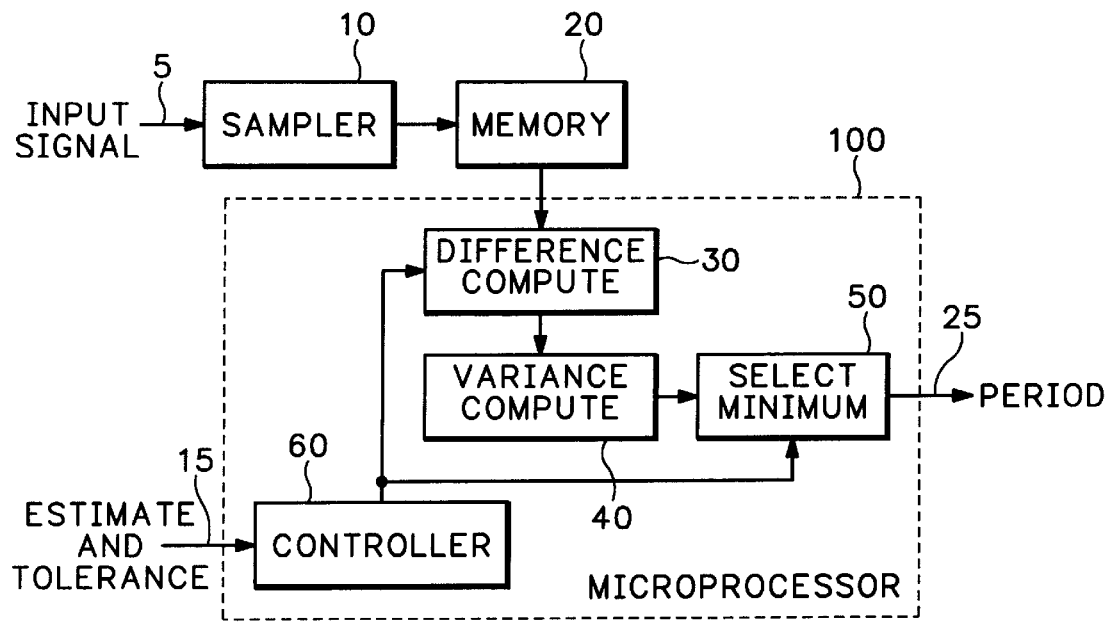
FIG. 1 is a block diagram of a system for sampling a periodic signal, and determining the period of that signal.

In the illustrated embodiment, the signal whose period is being determined is a sampled digital signal. Thus, discrete statistical techniques are described. FIG. 1 is a block diagram of a system for sampling a periodic signal, and determining the period of that signal. In FIG. 1, an input terminal 5 is coupled to a source (not shown) of a periodic input signal. For example, in a digitizing oscilloscope, input terminal 5 may be connected to the unit-under-test via a test lead. Input terminal 5 is coupled to an input terminal of a sampler 10. An output terminal of the sampler 10 is coupled to an input terminal of a memory 20. An output terminal of the memory 20 is coupled to an input terminal of a difference computing circuit 30. An output terminal of the difference computing circuit 30 is coupled to an input terminal of a variance computing circuit 40. An output terminal of the variance computing circuit 40 is coupled to an input terminal of a minimum selector 50. An output terminal of the minimum selector 50 is coupled to an output terminal 25. Output terminal 25 produces a signal representing the period of the input signal, and is coupled to utilization circuitry (not shown). The utilization circuitry may, for example, be a display device for displaying the period of the input signal, either on the oscilloscope screen or on a separate display device.

An input terminal 15 is coupled to a source (not shown) of a signal representing an initial estimate of the period of the input signal at input terminal 5, and a tolerance for that estimate. Input terminal 15 is coupled to an input terminal of a controller 60. An output terminal of the controller 60 is coupled to respective control input terminals of the difference computing circuit 30 and the minimum selector 50.

The difference computing circuit 30, the variance computing circuit 40, the minimum selector 50 and the controller 60 may be implemented in a microprocessor 100, as shown in phantom in FIG. 1. In such an implementation, the memory 20 may be coupled to the microprocessor 100 via a memory bus, or by an I/O interface, and the remaining signals may be coupled to the microprocessor 100 via I/O interfaces, all in a known manner. The microprocessor 100 may then be programmed to process the received control signals, and the samples from the memory, and to produce the period representative signal in the manner described in more detail below.

Figure 2:
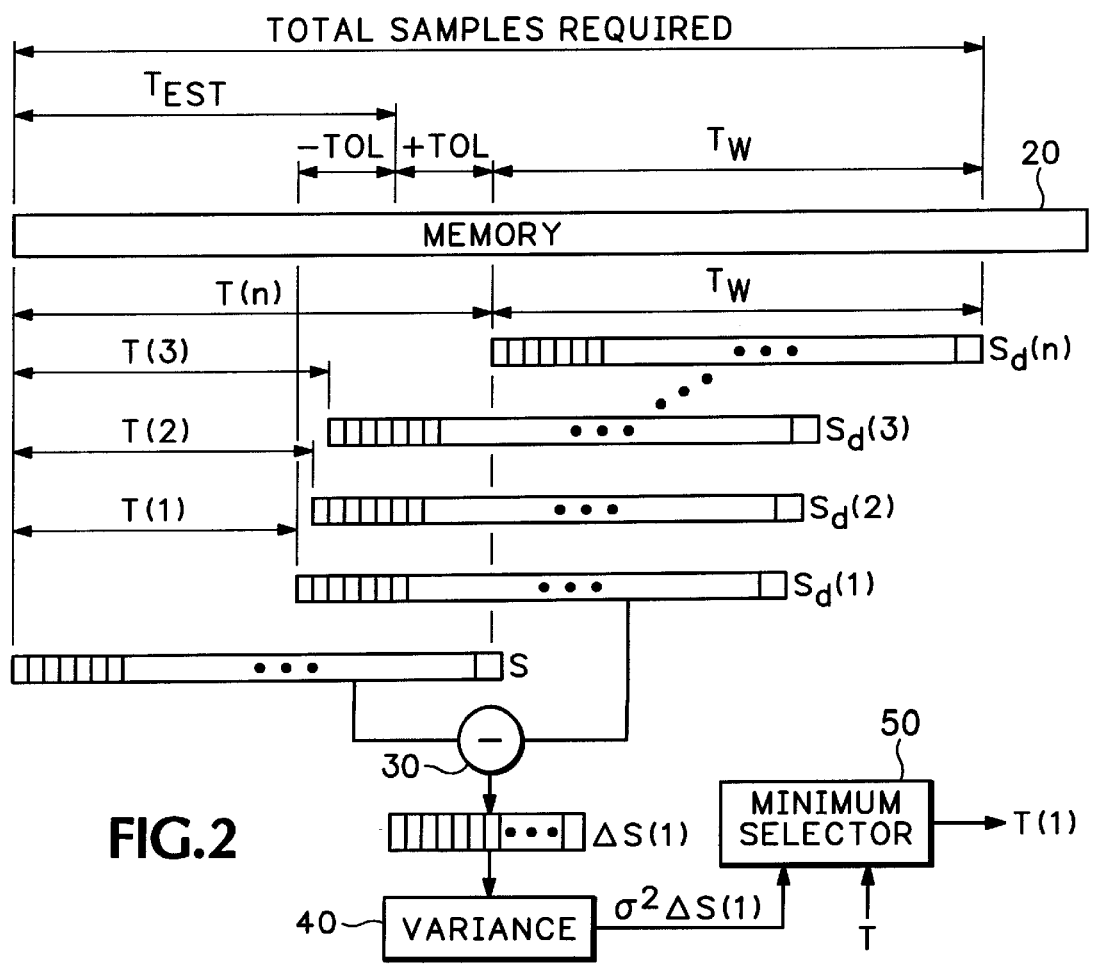
FIG. 2 is a memory layout, and process flowchart diagram useful in understanding the operation of the invention illustrated in FIG. 1.

FIG. 2 is a memory layout and process flowchart diagram useful in understanding the operation of the invention illustrated in FIG. 1. In operation, the sampler 10 samples the input signal, and stores the samples representing the input signal in locations in the memory 20 in a known manner. Referring to FIG. 2, memory 20 is represented as a rectangle. Time sequential samples are stored in corresponding locations in the memory 20 with the most recent sample at the left hand side, and the least recent sample at the right hand side. Although, this arrangement implies that the samples are stored in sequential memory locations, one skilled in the art will understand that this is not necessary, so long as the temporal order of the samples is maintained in some manner.

In the illustrated embodiment, an initial estimate $T_{EST}$ of the period, and a tolerance tol for that estimate, is received by the controller 60 (of FIG. 1). For example, a typical or nominal value for the period of a signal, and a tolerance for that value, may be known. This initial estimate ($T_{EST} \pm tol$) may be, and usually will be, provided by a user of the present invention and is used to determine a range of sample locations within which the periodic component is expected to repeat.

The width of a window $T_W$, representing a number w of consecutive samples, is selected. The width w of this window should be greater than or equal to the number of samples in the time period $T_{PER}+tol$ of the periodic component P, and thus, greater than or equal to the period of the periodic component P. This will ensure that the result of the operation of the present invention is the period $T_{PER}$ of the periodic component P, and not the period of a sub-pattern which repeats within the period $T_{PER}$ of the periodic component P. Within this constraint, the larger the number of samples, the more accurate the operation of the present invention.

A window of w samples is taken from the beginning (left hand side) of the samples stored in the memory 20, and represents the undelayed input signal S. Although represented in FIG. 2 by another rectangle containing w samples (implying a separate memory device), one skilled in the art will understand that it is not necessary to include a separate memory device to hold these samples; instead these samples may continue to reside in the memory 20. Another window of w samples is taken starting at the sample representing the initial estimate $T_{EST}-tol$. This window of w samples represents a version $S_d(1)$ of the input signal delayed by a time T(1).

The samples in the $S_d(1)$ window are subtracted by the subtracting operation 30 on a sample-by-sample basis from those in the S window to form a new window of samples representing the difference $\Delta S(1)$ between the window S representing the undelayed input signal and the window $S_d(1)$ representing the input signal delayed by time T(1). That is, the left most sample in the $S_d(1)$ window is subtracted from the left most sample in the S window and the difference is stored as the left most sample in the $\Delta S(1)$ window. The second sample in the $S_d(1)$ window is subtracted from the second sample in the S window and the difference stored as the second sample in the $\Delta S(1)$ window, and so forth.

$$\sigma_{\Delta S}^2 = \overline{x^2} - \overline{x}^2 \qquad (2)$$

$$= \frac{w \sum_{i=1}^{w} (x_i)^2 - \left( \sum_{i=1}^{w} x_i \right)^2}{w(w-1)}$$

The samples in the difference window $\Delta S(1)$ are then processed by the variance operation 40 to generate the variance $\sigma_{\Delta S}^2(1)$. One skilled in the art will understand how to calculate the variance of a window of samples. Referring to equation (2), the variance is equal to the mean of the samples squared, minus the square of the mean of the samples (see the first line of equation (2)), as is well known. More specifically, the second line of equation (2) illustrates the mathematical manipulations on the individual samples $x_i$. Each sample $x_i$ in the difference window $\Delta S(1)$, in turn, is squared, and the sum of the squared samples is calculated. This sum is multiplied by the number of samples w, and forms the first term in the numerator of the second line of equation (2). Then each sample $x_i$, is summed, and the sum of the samples squared to form the second term of the numerator of the second line of equation (2)). The difference between the first and second terms in the numerator are divided by w(w−1) to form the variance $\sigma^2_{\Delta S}(1)$ The minimum selector operation 50 retains this variance $\sigma^2_{\Delta S}(1)$ along with the associated value of T(1).

Then samples from the memory 20 representing the input signal S delayed by a time T(2) are then supplied to a window $S_d(2)$. The samples in the second window $S_d(2)$ are processed in the identical manner as those in the first window $S_d(1)$ described above. In this case, the variance operation 40 produces a variance $\sigma^2_{\Delta S}(2)$. The minimum selector operation 50 also retains this variance $\sigma^2_{\Delta S}(2)$ along with the associated value of T(2). This continues for all values of T: T(1), T(2), T(3) ... T(n), within the previously supplied tolerance tol of the estimated period $T_{EST}$ of the periodic component. The time T(i) associated with the minimum variance $\sigma^2_{\Delta S}(i)$ is selected by the minimum selector operation 50 to be the period of the periodic component of the input signal.

In the illustrated embodiment, an initial estimate, and a tolerance around that estimate was received from a user and used to constrain the delay times of the delayed signal $S_d(T)$. Other schemes for constraining the selection of the delay times T may be used, and one skilled in the art will understand from the above description how to select the delay times T according to such schemes. For example, the times T could start from the beginning of the stored samples (left hand side of memory 20), and continue through all the stored samples until the minimum variance is found.

In addition, the illustrated embodiment was described in terms of discrete random variables, and used sampled and digitized samples. One skilled in the art will understand that a similar analysis applies for continuous random variables, and the invention is equally related to sampled analog signals as well as continuous analog signals, and will understand how to generate the analog and analog sampled signals corresponding to the sampled and digitized signals shown in the illustrated embodiment.

What is claimed is:

1. A method for determining the period of a periodic signal, possibly including noise, comprising the steps of:

computing a signal representing the difference between the periodic signal, and the periodic signal delayed by a time T;

computing the variance of the difference representative signal;

repeating the difference computing and variance computing steps for different times T; and determining the period of the periodic signal to be the time T producing the minimum variance.

2. The method of claim 1 further comprising the steps of, before the difference computing step:

receiving an initial estimate of the period, and a tolerance for the initial estimate; and setting the time T to a value within the tolerance of the initial estimate of the period; and wherein:

the repeating step comprises repeating the difference computing and variance computing steps for different times T within the tolerance of the initial estimate of the period.

3. The method of claim 2 wherein the samples are time sequential samples, and:

the difference computing step comprises computing samples representing the difference between respective samples representing the sampled periodic signal, and corresponding samples temporally separated by a number of samples corresponding to the time T.

4. The method of claim 1 wherein the periodic signal is a sampled periodic signal, and:

the difference computing step comprises computing samples representing the difference between respective samples representing the sampled periodic signal, and corresponding samples representing the sampled periodic signal delayed by the time T; and the variance computing step comprises computing the variance of the difference representative samples.

5. The method of claim 4 wherein the difference computing step comprises the steps of:

selecting a first window of samples comprising a plurality of w samples representing the sampled periodic signal;

selecting a second window of samples comprising a plurality of w samples representing the sampled period signal delayed by the time T;

generating a difference window of samples comprising a plurality of w samples in which a respective samples in the difference window of samples is equal to the difference between a corresponding sample in the first window and a corresponding sample in the second window.

6. The method of claim 4 wherein the variance computing step comprises the step of computing the variance of the sample in the difference window of sample.

7. The method of claim 6 wherein the repeating step comprises the step of selecting samples separated by incremental number of samples corresponding to the different times T.

8. The method of claim 1 wherein the period determining step comprises the steps of:

storing each time T and corresponding computed variance and selecting the stored time T corresponding to the minimum retained computed variance as the period of the periodic signal.

9. Apparatus for determining the period of a periodic signal, comprising:

an input for receiving the periodic signal;

a difference circuit, coupled to the periodic signal source, for computing a signal representing the difference between the periodic signal, and the periodic signal delayed by a time T;

a variance circuit, coupled to the difference circuit, for computing a signal representing the variance of the difference representative signal;

a control circuit, coupled to the difference circuit for varying the time T; and a minimum selector, coupled to the variance circuit and the control circuit, for selecting the time T producing the minimum variance as the period of the periodic signal.

10. The apparatus of claim 9 wherein the periodic signal source comprises:
   an input for receiving the periodic signal;
   a sampler, coupled to a analog signal source; and
   a memory for storing samples representing the periodic signal.

11. The apparatus of claim 10, wherein:
   the difference computing circuit is coupled to the memory, and computes the difference between respective stored samples representing an sampled periodic signal, and corresponding stored samples representing the sampled periodic signal delayed by the time T; and
   the variance computing circuit is coupled to the difference computing circuit, and computes the variance of the difference representative samples.

12. The apparatus of claim 11, wherein the difference computing circuit comprises:
   circuitry for extracting a first window of w samples representing the sampled periodic signal;
   circuitry for extracting a second window of w samples representing the sampled periodic signal delayed by the time T; and
   circuitry for generating a difference window of w samples representing the difference between respective samples in the first window and corresponding samples in the second window.

13. The apparatus of claim 12 wherein the variance computing circuit computes the variance of the w samples in the difference window.

14. The apparatus of claim 9 wherein the minimum selector comprises:
   circuitry for storing each variance and the corresponding time T; and
   circuitry for selecting the time T corresponding to the minimum stored variance as the period of the periodic signal.

* * * * *